(12) United States Patent
Yu et al.

(10) Patent No.: US 8,797,701 B2
(45) Date of Patent: Aug. 5, 2014

(54) ELECTRONIC LOAD FOR TESTING VOLTAGE STABILITY

(75) Inventors: Qi-Long Yu, Guangdong (CN); Tsung-Jen Chuang, New Taipei (TW); Jun Zhang, Guangdong (CN); Jun-Wei Zhang, Guangdong (CN)

(73) Assignees: Fu Tai Hua Industry (Shenzhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 33 days.

(21) Appl. No.: 13/541,662

(22) Filed: Jul. 4, 2012

(65) Prior Publication Data

US 2013/0308240 A1    Nov. 21, 2013

(30) Foreign Application Priority Data

May 15, 2012 (CN) .......................... 2012 1 0149567

(51) Int. Cl.
  *H02H 7/00*    (2006.01)
(52) U.S. Cl.
  USPC ........................................... 361/103; 361/18

(58) Field of Classification Search
  USPC ................................. 361/93.7–93.9, 103, 18
  See application file for complete search history.

(56) References Cited

U.S. PATENT DOCUMENTS

| | | | | |
|---|---|---|---|---|
| 6,005,761 A | * | 12/1999 | Izawa et al. | 361/103 |
| 6,678,137 B1 | * | 1/2004 | Mason et al. | 361/103 |
| 7,015,680 B2 | * | 3/2006 | Moraveji et al. | 323/274 |

* cited by examiner

*Primary Examiner* — Danny Nguyen
(74) *Attorney, Agent, or Firm* — Novak Druce Connolly Bove + Quigg LLP

(57) ABSTRACT

An electronic load for testing stability of a power voltage of a power source under test (PSUT) includes a voltage supply device, a field effect transistor (FET), an amplification circuit, and a current sampling resistor. The amplification circuit includes a first input, a second input, and an output. The voltage supply device is connected to the first input. The second input is connected to a source electrode of the FET. The output is connected to a gate electrode of the FET. A drain electrode of the FET is connected to the PSUT. One end of the current sampling resistor is grounded, and the other end of the current sampling resistor is connected to the source electrode of the FET and the second input. The voltage supply device outputs a control voltage. The amplification circuit amplifies the control voltage and drives the FET using the amplified control voltage.

20 Claims, 1 Drawing Sheet

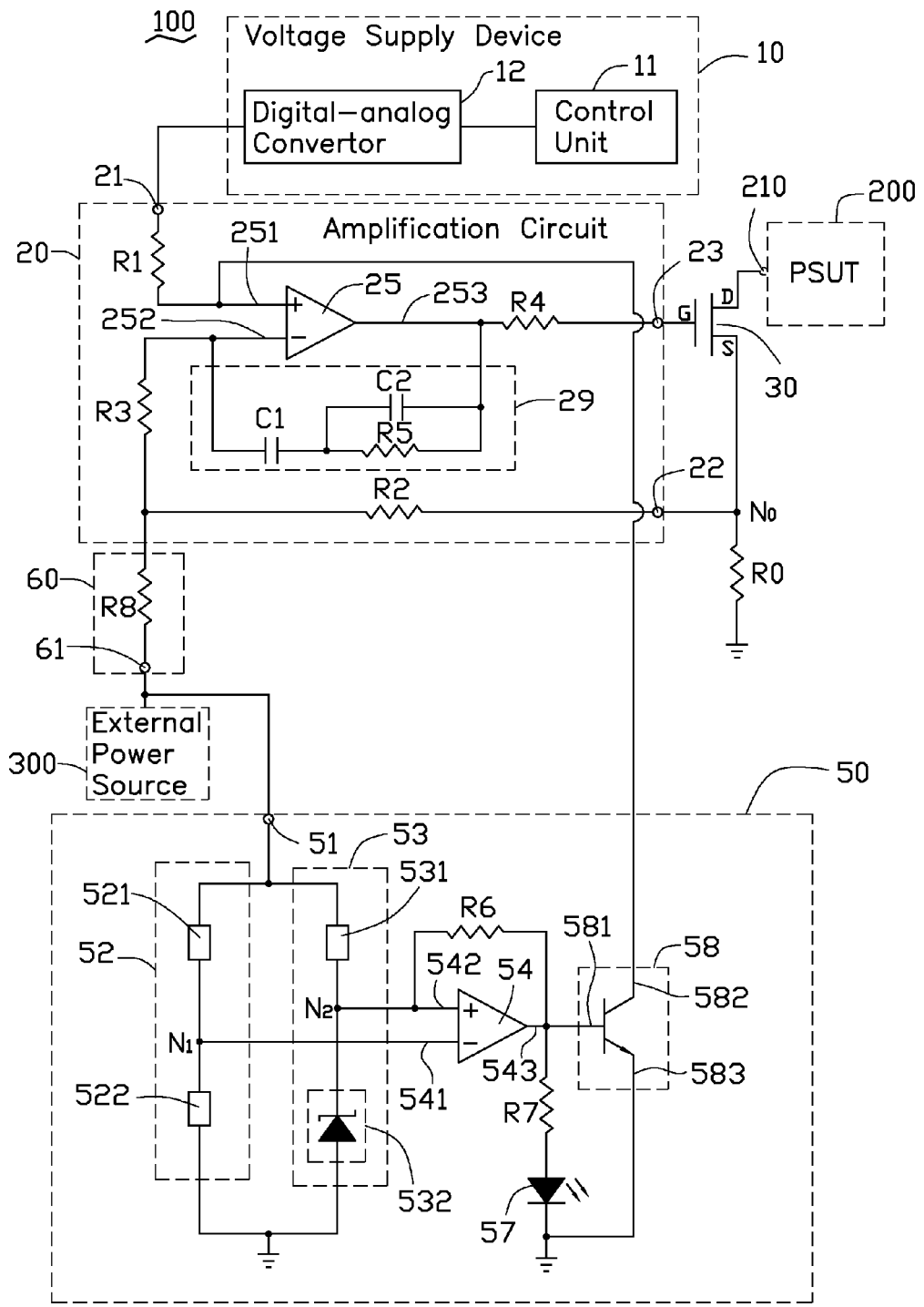

ELECTRONIC LOAD FOR TESTING VOLTAGE STABILITY

BACKGROUND

1. Technical Field

The present disclosure relates to electronic loads used for testing electrical equipment, and more particularly to an electronic load for testing the stability of a power voltage of a power source.

2. Description of Related Art

In the power supply industry, a stability test is an important process before a power source, such as a power supply or an uninterruptible power system, is put on the market. An electronic load is needed when testing the stability of the power source. A sliding rheostat may be used as the electronic load. However, the sliding rheostat is unsuitable for some testing because of its inherent characteristics. For example, the sliding rheostat does not have the characteristic of a constant current load. In addition, the sliding rheostat has an inductance characteristic because the sliding rheostat is wound with coils. Therefore, a testing result acquired by the sliding rheostat may be not accurate.

What is needed, therefore, is an electronic load that can overcome the aforementioned problems.

BRIEF DESCRIPTION OF THE DRAWING

The components in the drawing are not necessarily drawn to scale, the emphasis instead being placed upon clearly illustrating the principles of the present disclosure.

The drawing is a circuit diagram of an electronic load according to an exemplary embodiment of the present disclosure.

DETAILED DESCRIPTION

Reference will be made to the drawing to describe specific exemplary embodiments of the present disclosure in detail.

Referring to the drawing, the electronic load 100 for testing stability of a power voltage of a power source under test (PSUT) 200 includes a voltage supply device 10, an amplification circuit 20, a field effect transistor (FET) 30, a current sampling resistor R0, a first protection circuit 50, and a second protection circuit 60.

The voltage supply device 10 provides a control voltage, such as a voltage in the range from 0 volts to 4 volts, to the amplification circuit 20. The voltage supply device 10 includes a control unit 11 and a digital-analog convertor (DAC) 12. The control unit 11 outputs a digital voltage control signal to the DAC 12. The digital voltage control signal can for example be a constant voltage control signal, or a dynamic voltage control signal, or a combination of a constant voltage control signal and a dynamic voltage control signal. The DAC 12 converts the digital voltage control signal from the control unit 11 into a control voltage, and outputs the control voltage to the amplification circuit 20. In the illustrated embodiment, the control unit 11 may be a programmable control unit, for example. The programmable control unit may be a single-chip microcomputer (SCM), for example.

The amplification circuit 20 amplifies the control voltage output from the voltage supply device 10, and drives the FET 30 using the amplified control voltage. In detail, the amplification circuit 20 includes a first input 21, a second input 22, an output 23, an input resistor R1, an operational amplifier 25, a first feedback resistor R2, a second feedback resistor R3, an output resistor R4, and a compensation circuit 29. The first input 21 receives the control voltage output from the DAC 12. A positive input 251 of the operational amplifier 25 is connected to the first input 21 via the input resistor R1. A negative input 252 of the operational amplifier 25 is connected to one end of the second feedback resistor R3. The other end of the second feedback resistor R3 is connected to the second input 22 via the first feedback resistor R2. An output 253 of the operational amplifier 25 is connected to the output 23 via the output resistor R4.

The compensation circuit 29 filters out high-frequency interference signals in the amplified control voltage output from the output 253 of the operational amplifier 25. The compensation circuit 29 includes a first filter capacitor C1, a second filter capacitor C2, and a filter resistor R5. The first filter capacitor C1 and the filter resistor R5 are connected in series between the negative input 252 and the output 253. The second filter capacitor C2 and the filter resistor R5 are connected in parallel between the first filter capacitor C1 and the output 253.

A drain electrode D of the FET 30 is connected to a voltage output 210 of the PSUT 200. A gate electrode G of the FET 30 is connected to the output 23 of the amplification circuit 20. A source electrode S of the FET 30 is connected to the second input 22 of the amplification circuit 20. A node $N_0$ is defined between the source electrode S and the second input 22 and ground. The FET 30 can for example be a high-performance, high-power N type FET. The FET 30 is configured to function as a voltage dependent resistor under the control of the amplification circuit 20.

One end of the current sampling resistor R0 is grounded, and the other end of the current sampling resistor R0 is connected to the node $N_0$. The current sampling resistor R0 samples the current flowing therethrough during a voltage test of the PSUT 200, so as to establish the stability of the power voltage output from the PSUT 200.

The first protection circuit 50 is connected to the amplification circuit 20. The first protection circuit 50 detects the operating temperature of the electronic load 100, and automatically disconnects the electronic load 100 when the operating temperature of the electronic load 100 exceeds a predetermined threshold temperature. In the embodiment, the predetermined threshold temperature can be 70° C., for example. The first protection circuit 50 includes a first power input 51, a first voltage dividing circuit 52, a second voltage dividing circuit 53, a comparator 54, a positive feedback resistor R6, a current limiting resistor R7, a light emitting diode (LED) 57, and a switch 58.

The first voltage dividing circuit 52 includes a first voltage dividing element 521 and a second voltage dividing element 522. The first and second voltage dividing elements 521, 522 are connected in series between the first power input 51 and ground. The second voltage dividing circuit 53 includes a third voltage dividing element 531 and a temperature sensor 532. The third voltage dividing element 531 and the temperature sensor 532 are connected between the first power input 51 and ground in series. A resistance of the temperature sensor 532 varies with temperature. A first voltage-dividing node $N_1$ is defined between the first voltage dividing element 521 and the second voltage dividing element 522. A second voltage-dividing node $N_2$ is defined between the third voltage dividing element 531 and the temperature sensor 532.

The comparator 54 includes a first input 541, a second input 542, and an output 543. The switch 58 includes a control end 581, a first conductive end 582, and a second conductive end 583. The first power input 51 is connected to an external power source 300. The external power source 300 supplies an operating voltage to the electronic load 100, so as to enable the electronic load 100 to function as a load. The operating voltage may be 5 volts, for example. The first input 541 of the comparator 54 is connected to the first voltage-dividing node $N_1$. The second input 542 of the comparator 54 is connected to the second voltage-dividing node $N_2$. The output 543 of the comparator 54 is connected to the control end 581 of the switch 58, and is further connected to one end of the current limiting resistor R7. The other end of the current limiting resistor R7 is grounded via the LED 57. The first conductive end 582 of the switch 58 is connected to the positive input 251 of the operational amplifier 25. The second conductive end 583 of the switch 58 is grounded. The positive feedback resistor R6 is connected between the second input 542 and the output 543 of the comparator 54. In the embodiment, the first, second, and third voltage dividing elements 521, 522, 531 can each be a resistor, for example; the switch 58 can be a negative-positive-negative (NPN) transistor, for example; and the temperature sensor 532 can be a positive coefficient thermal resistor or a temperature-detecting chip, for example.

As long as the operating temperature of the electronic load 100 does not exceed the predetermined threshold temperature, the voltage of the first voltage-dividing node $N_1$ is substantially equal to or greater than the voltage output from the second voltage-dividing node $N_2$. Therefore, the comparator 54 outputs a first control signal (i.e. a low-level signal) to switch off the switch 58. Based on the first control signal, the LED 57 remains unlit.

In contrast, when the temperature of the electronic load 100 exceeds the predetermined threshold temperature, the voltage output from the first voltage-dividing node $N_1$ is less than the voltage output from the second voltage-dividing node $N_2$. The comparator 54 outputs a second control signal (i.e. a high-level signal) to switch on the switch 58. The positive input 251 of the operational amplifier 25 is grounded via the switched-on switch 58. That is, the voltage of the positive input 251 becomes zero volts (0V). Correspondingly, the FET 30 is switched off. The electronic load 100 stops working in response to the switched-off FET 30. At the same time, the LED 57 is activated based on the second control signal and emits light so as to warn a user that the electronic load 100 is overheating.

The second protection circuit 60 is connected to the amplification circuit 20 and prevents the FET 30 from being damaged when the electronic load 100 is suddenly powered on (connected) or off (disconnected). The second protection circuit 60 includes a second power input 61 and a protective resistor R8. One end of the protective resistor R8 is connected to the second power input 61. The other end of the protective resistor R8 is connected to the node $N_0$ via the first feedback resistor R2. The resistance of the protective resistor R8 may be high, 1 megaohm (MΩ), for example. When the electronic load 100 is suddenly powered on or off by the external power source 300, the voltage applied on the negative input 252 is more than the voltage applied on the positive input 251 due to the protective resistor R8 being connected between the external power source 300 and the negative input 252 of the operational amplifier 25. Accordingly, the FET 30 is switched off when the electronic load 100 is suddenly powered on or off, such that the FET 30 is prevented from being damaged.

Operation of the electronic load 100 for detecting the stability of the power voltage output from the PSUT 200 is briefly described as follows:

When the electronic load 100 is electrically connected to the external power source 300, the electronic load 100 is enabled to work as a load. After the electronic load 100 is suddenly powered on, the operational amplifier 25 works in a linear amplification area. The positive input 251 and the negative input 252 are shorted. Accordingly, the voltage of the positive input 251 is substantially equal to each of the voltage of the negative input 252 and the power voltage output from the voltage supply device 10. The voltage of the positive input 251 is represented by V1. The voltage of the negative input 252 is represented by V2. The control voltage output from the voltage supply device 10 is represented by Vout. That is, V1=V2=Vout. In addition, because an input impedance of the operational amplifier 25 is infinite and a resistance of the protective resistor R8 is great, no significant current can flow through the first and second feedback resistors R2, R3. Accordingly, a potential voltage of the node $N_0$ equals the voltage of the negative input 252. The voltage of the node $N_0$ is represented by V0. Therefore the voltage of the current sampling resistor R0, represented herein by V3, satisfies the relationship: V3=V0=V2=V1=Vout. Accordingly, a current flowing through the current sampling resistor R0, represented herein by I3, satisfies the formula: I3=V3/R0=Vout/R0.

In addition, when the electronic load 100 is operating normally, a voltage difference $V_{GS}$ between the gate electrode G and the source electrode S of the FET 30 is more than 0V. A current flowing through the FET 30 is represented herein by $I_D$, and relates to a voltage difference $V_{DS}$ formed between the drain electrode D and the source electrode S of the FET 30. The current $I_D$ of the FET 30 is substantially equal to the current I3 of the current sampling resistor R0. That is, $I_D$=I3=Vout/R0. Therefore, the current $I_D$ flowing through the FET 30 is determined by the control voltage Vout from the voltage supply device 10. In detail, when the DAC 12 outputs a constant analog control voltage under the control of the control unit 11, the current $I_D$ maintains a constant value. When the DAC 12 outputs a dynamic analog control voltage under the control of the control unit 11, the current $I_D$ of the FET 30 varies correspondingly.

According to the above-described configurations, during the test, the stability of the power voltage output from the PSUT 200 is acquired by sampling the current flowing through the current sampling resistor R0.

Since the electronic load 100 is formed by the above-described circuit, the electronic load 100 not only has the characteristic of a constant current load, but also has the characteristic of a dynamic current load, which renders the electronic load 100 suitable for more testing situations. Further, because the electronic load 100 employs the NPN transistor which functions as the voltage dependent resistor instead of using a coil-wound sliding rheostat, a testing result acquired by the electronic load 100 is apt to be more accurate.

Alternatively, the temperature sensor 532 can be a negative coefficient thermal resistor, and accordingly, the switch 58 can be a positive-negative-positive (PNP) transistor. In addition, the LED 57 can be omitted.

Alternatively, one of the first voltage dividing element 521 and the second voltage dividing element 522 can be replaced by a capacitor. In addition, the third voltage dividing element 531 may be also formed by a capacitor. Furthermore, the first and second protection circuits 50, 60, the second feedback resistor R3, and the compensation circuit 29 can be omitted.

It is believed that the present embodiments and their advantages will be understood from the foregoing description, and it will be apparent that various changes may be made thereto without departing from the spirit and scope of the embodiments or sacrificing all of their material advantages.

What is claimed is:
1. An electronic load for testing stability of a power voltage of a power source, comprising:

a voltage supply device configured to provide a control voltage and comprising a control unit and a digital-analog convertor (DAC), the control unit outputting a digital voltage control signal to the DAC, and the DAC converting the digital voltage control signal into a corresponding analog control voltage and outputting the converted analog control voltage;

a field effect transistor (FET) comprising a gate electrode, a source electrode, and a drain electrode, the drain electrode connected to the power source;

an amplification circuit electrically connected with the voltage supply device and configured to amplify the control voltage from the voltage supply device and drive the FET using the amplified control voltage, the amplification circuit comprising a first input connected to the voltage supply device to receive the converted analog control voltage, a second input connected to the source electrode of the FET, and an output connected to the gate electrode of the FET; and a current sampling resistor comprising one end connected to ground and the other end connected to the source electrode of the FET and the second input of the amplification circuit.

2. The electronic load of claim 1, wherein the amplification circuit further comprises an operational amplifier and a first feedback resistor, a positive input of the operational amplifier is connected to the first input of the amplification circuit, a negative input of the operational amplifier is connected to the second input of the amplification circuit via the first feedback resistor, and an output of the operational amplifier is connected to the output of the amplification circuit.

3. The electronic load of claim 2, wherein the amplification circuit further comprises a compensation circuit connected between the negative input and the output of the operational amplifier, and the compensation circuit filters out high-frequency interference signals in the amplified control voltage output from the output of the operational amplifier.

4. The electronic load of claim 3, wherein the compensation circuit comprises a first filter capacitor, a second filter capacitor, and a filter resistor, the first filter capacitor and the filter resistor are connected in series between the negative input and the output of the operational amplifier, and the second filter capacitor and the filter resistor are connected in parallel between the first filter capacitor and the output of the operational amplifier.

5. The electronic load of claim 2, further comprising a first protection circuit that detects an operating temperature of the electronic load and switches off the FET when the operating temperature exceeds a predetermined threshold temperature.

6. The electronic load of claim 5, wherein the first protection circuit switches off the FET by adjusting the voltage applied on the positive input of the operational amplifier.

7. The electronic load of claim 6, wherein the first protection circuit comprises a first power input, a first voltage dividing circuit, a second voltage dividing circuit, a comparator, and a switch, the comparator comprises a first input, a second input, and an output, the switch comprises a control end, a first conductive end, and a second conductive end, the first power input is connected to an external power source, the first voltage dividing circuit comprises a first voltage dividing element and a second voltage dividing element, the second dividing circuit comprises a second voltage dividing element and a temperature sensor, the first voltage dividing element and the second voltage dividing element are connected in series between the first power input and ground, the third voltage dividing element and the temperature sensor are connected in series between the first power input and ground, a first voltage-dividing node is defined between the first voltage dividing element and the second voltage dividing element, a second voltage-dividing node is defined between the third voltage dividing element and the temperature sensor, the first input of the comparator is connected to the first voltage-dividing node, the second input of the comparator is connected to the second voltage-dividing node, the output of the comparator is connected to the control end of the switch, the first conductive end of the switch is connected to the positive input of the operational amplifier, and the second conductive end of the switch is grounded.

8. The electronic load of claim 7, wherein the resistance of the temperature sensor varies with temperature.

9. The electronic load of claim 7, wherein the switch is a negative-positive-negative (NPN) transistor.

10. The electronic load of claim 7, wherein each of the first, second, and third voltage dividing elements is a resistor.

11. The electronic load of claim 7, wherein the temperature sensor is one of a thermal resistor and a temperature-detecting chip.

12. The electronic load of claim 7, wherein when the temperature sensor detects that the operating temperature of the electronic load does not exceed the predetermined threshold temperature, the voltage of the first voltage-dividing node is substantially equal to or greater than the voltage of the second voltage-dividing node, the comparator outputs a first control signal to the control end of the switch, and the switch is switched off under the control of the first control signal; and when the temperature sensor detects that the operating temperature of the electronic load exceeds the predetermined threshold temperature, the voltage of the first voltage-dividing node is less than the voltage of the second voltage-dividing node, the comparator outputs a second control signal instead of the first control signal to the control end of the switch, and the switch is switched on under the control of the second control signal.

13. The electronic load of claim 12, wherein the first protection circuit further comprises a positive feedback resistor, and the positive feedback resistor is connected between the second input of the comparator and the output of the comparator.

14. The electronic load of claim 12, wherein the first protection circuit further comprises a light emitting diode and a current limiting resistor, the output of the comparator is further connected to one end of the current limiting resistor, and the other end of the current limiting resistor is grounded via the anode and cathode of the light emitting diode in sequence.

15. The electronic load of claim 7, wherein the amplification circuit further comprises a second feedback resistor, and the second feedback resistor is connected between the negative input of the operational amplifier and the first feedback resistor.

16. The electronic load of claim 15, further comprising a second protection circuit connected between the external power source and the amplification circuit, wherein the second protection circuit prevents the FET from being damaged when the electronic load is suddenly powered on or off by the external power source.

17. The electronic load of claim 16, wherein the second protection circuit comprises a protective resistor and a second power input, the second power input is connected to the external power source, one end of the protective resistor is connected to the second power input, and the other end of the protective resistor is connected to the negative input of the operational amplifier via the second feedback resistor.

18. The electronic load of claim 2, wherein the digital voltage control signal is one of a constant voltage control signal, a dynamic voltage control signal, and a combination of a constant voltage control signal and a dynamic voltage control signal.

19. The electronic load of claim 2, wherein the control unit is a programmable control unit.

20. An electronic load for testing stability of a power voltage of a power source, comprising:

a voltage supply device configured to provide a control voltage;

a field effect transistor (FET) comprising a gate electrode, a source electrode, and a drain electrode, the drain electrode connected to the power source;

an amplification circuit electrically connected with the voltage supply device and configured to amplify the control voltage from the voltage supply device and drive the FET using the amplified control voltage, the amplification circuit comprising a first input connected to the voltage supply device, a second input connected to the source electrode of the FET, an output connected to the gate electrode of the FET, an operational amplifier, and a feedback resistor, wherein a positive input of the operational amplifier is connected to the first input of the amplification circuit, a negative input of the operational amplifier is connected to the second input of the amplification circuit via the first feedback resistor, and an output of the operational amplifier is connected to the output of the amplification circuit; and a current sampling resistor comprising one end connected to ground and the other end connected to the source electrode of the FET and the second input of the amplification circuit; and a first protection circuit detecting an operating temperature of the electronic load and switches off the FET when the operating temperature exceeds a predetermined threshold temperature by adjusting the voltage applied on the positive input of the operational amplifier.

* * * * *